(12) United States Patent
Maes et al.

(10) Patent No.: US 12,222,644 B2
(45) Date of Patent: *Feb. 11, 2025

(54) METHOD OF FORMING AN ENHANCED UNEXPOSED PHOTORESIST LAYER

(71) Applicant: ASM IP Holding B.V., Almere (NL)

(72) Inventors: Jan Willem Maes, Wilrijk (BE); Krzysztof Kamil Kachel, Chandler, AZ (US); David Kurt de Roest, Kessel-Lo (BE)

(73) Assignee: ASM IP Holding B.V., Almere (NL)

( * ) Notice: Subject to any disclaimer, the term of this patent is extended or adjusted under 35 U.S.C. 154(b) by 926 days.

This patent is subject to a terminal disclaimer.

(21) Appl. No.: 17/231,299

(22) Filed: Apr. 15, 2021

(65) Prior Publication Data

US 2021/0247693 A1 Aug. 12, 2021

Related U.S. Application Data

(63) Continuation of application No. 16/167,164, filed on Oct. 22, 2018, now Pat. No. 11,022,879.

(60) Provisional application No. 62/590,516, filed on Nov. 24, 2017.

(51) Int. Cl.
*G03F 7/004* (2006.01)
*C23C 16/455* (2006.01)
*G03F 7/00* (2006.01)
*G03F 7/16* (2006.01)
*H01L 21/027* (2006.01)

(52) U.S. Cl.
CPC ...... *G03F 7/0043* (2013.01); *C23C 16/45544* (2013.01); *C23C 16/45546* (2013.01); *C23C 16/45557* (2013.01); *C23C 16/45559* (2013.01); *G03F 7/0042* (2013.01); *G03F 7/16* (2013.01); *G03F 7/168* (2013.01); *G03F 7/70033* (2013.01); *G03F 7/70808* (2013.01); *H01L 21/0273* (2013.01)

(58) Field of Classification Search
None
See application file for complete search history.

(56) References Cited

U.S. PATENT DOCUMENTS

| | | | |
|---|---|---|---|
| 8,980,418 B2 | 3/2015 | Darling | |
| 11,022,879 B2* | 6/2021 | Maes | G03F 7/168 |
| 2010/0184297 A1* | 7/2010 | Takagi | H01J 37/32449 |
| | | | 438/706 |
| 2012/0241411 A1* | 9/2012 | Darling | H01L 21/3065 |
| | | | 216/67 |
| 2014/0263172 A1 | 9/2014 | Xie et al. | |
| 2018/0108587 A1* | 4/2018 | Jiang | H01L 21/67017 |
| 2018/0173109 A1* | 6/2018 | Gronheid | G03F 7/38 |

* cited by examiner

*Primary Examiner* — Charlee J. C. Bennett
(74) *Attorney, Agent, or Firm* — Snell & Wilmer L.L.P.

(57) ABSTRACT

The method relates to a method of forming an enhanced unexposed photoresist layer from an unexposed photoresist layer on a substrate by increasing the sensitivity of the unexposed photoresist to exposure radiation. The method comprises: providing the substrate with the unexposed photoresist layer in a reaction chamber; providing a first precursor comprising a portion of a photosensitizer sensitive to exposure radiation in the reaction chamber; and, infiltrating the unexposed photoresist layer on the substrate with the first precursor.

18 Claims, 3 Drawing Sheets

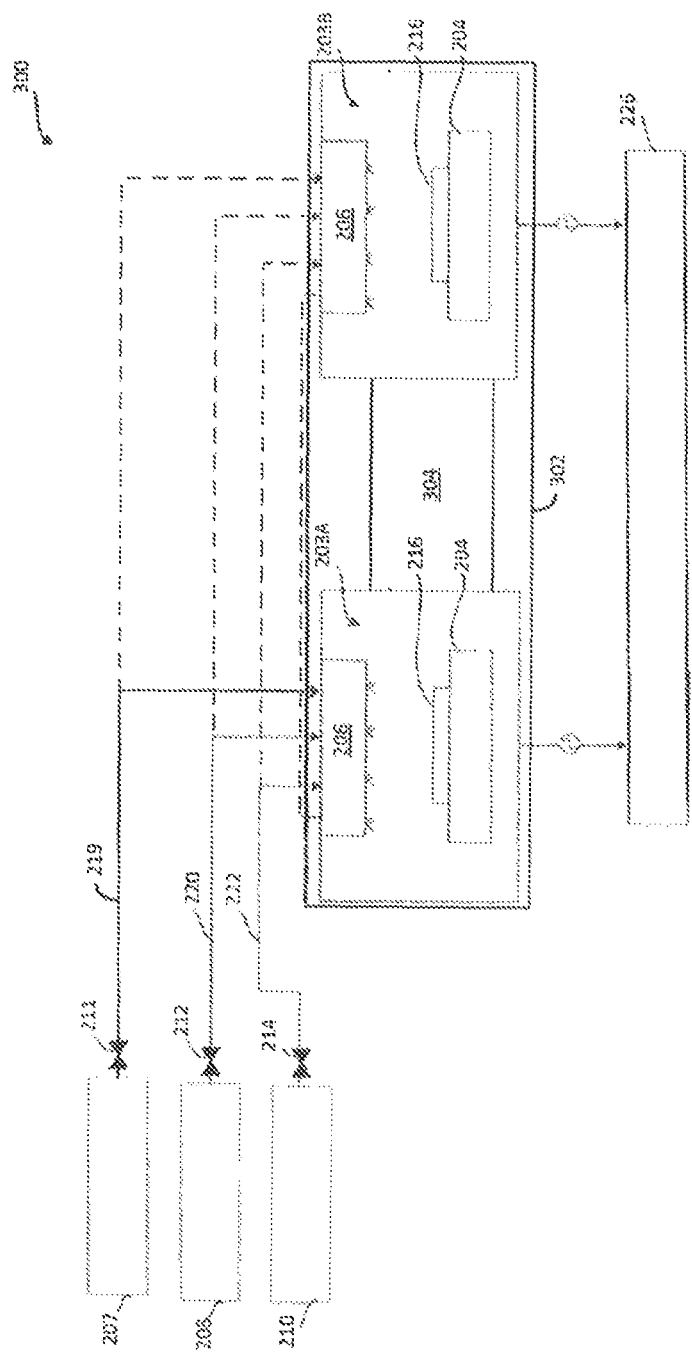

METHOD OF FORMING AN ENHANCED UNEXPOSED PHOTORESIST LAYER

CROSS-REFERENCE TO RELATED APPLICATIONS

This application is a continuation of and claims priority to U.S. patent application Ser. No. 16/167,164 filed Oct. 22, 2018 titled "METHOD OF FORMING AN ENHANCED UNEXPOSED PHOTORESIST LAYER," which claims the benefit of U.S. Provisional Patent Application Ser. No. 62/590,516, filed on Nov. 24, 2017, titled "METHOD OF FORMING AN ENHANCED UNEXPOSED PHOTORESIST LAYER," the disclosures of which are hereby incorporated by reference in their entirety.

FIELD OF INVENTION

The present disclosure generally relates to methods and systems for manufacturing electronic devices. More particularly, the disclosure relates to methods of forming an enhanced unexposed photoresist layer.

BACKGROUND

As the trend has pushed semiconductor devices to smaller and smaller sizes, different patterning techniques have arisen. These techniques include immersion (ArF) lithography with an exposure radiation at 193 nm combined with double or quadruple patterning, extreme ultraviolet lithography (EUV) with an exposure radiation around 13.5 nm, and EUV combined with double or quadrupole patterning.

The patterning techniques may utilize at least one photoresist disposed on a substrate to enable high resolution patterning of the substrate by the exposure radiation of a lithography system. To satisfy the requirements of both high resolution and low line-edge roughness, the photoresist may be a thin layer.

However, photoresists may have several drawbacks. In particular, high resolution photoresists may have low sensitivity to the radiation used in the lithography step. The sensitivity of the unexposed photoresist may be defined as the minimum energy in mJ/cm2 that may be required to generate a well-defined feature in the photoresist on the substrate. The sensitivity of a photoresist is important when using deep ultraviolet (ArF) or extreme ultraviolet (EUV) exposure radiation. For example in lithography the radiation intensity generated by the tool may be low and therefor the throughput of the tool may be low if a photoresist is used with a low sensitivity.

It may therefore be advantageous to enhance the sensitivity of the unexposed photoresist to the exposure radiation of the lithography tool to enhance the throughput of the lithographic tool.

SUMMARY

In accordance with at least one embodiment of the invention there is provided a method of forming an enhanced unexposed photoresist layer with an increased sensitivity to exposure radiation from an unexposed photoresist layer on a substrate by:
  providing the substrate with the unexposed photoresist layer in a reaction chamber;
  providing a first precursor comprising at least a portion of a photosensitizer sensitive to exposure radiation to the substrate in the reaction chamber thereby infiltrating the unexposed photoresist layer on the substrate with the first precursor for a first period T1. By infiltrating the unexposed photoresist layer on the substrate with the first precursor comprising at least a portion of a photosensitizer sensitive to exposure radiation for a first period T1 the amount of photosensitizer can be increased in the unexposed photoresist layer. The amount of photosensitizer in the photoresist may be limited for example because of its insolubility in the photoresist before spinning it on the substrate. By infiltrating at least a portion of the photosensitizer after the unexposed photoresist layer is spun on the substrate extra photosensitizer may be provided in the photoresist layer.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

These and other features, aspects, and advantages of the invention disclosed herein are described below with reference to the drawings of certain embodiments, which are intended to illustrate and not to limit the invention.

FIG. 3 illustrates a system for performing methods in accordance with embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Embodiments in accordance with the invention relate to the combination of hard masks with a film infiltration processes. This combination of a unexposed photoresist layer and infiltration processes can alter the properties (e.g., etch rate or even LER of width of patterned features) of the unexposed photoresist layer significantly.

Figure 1:
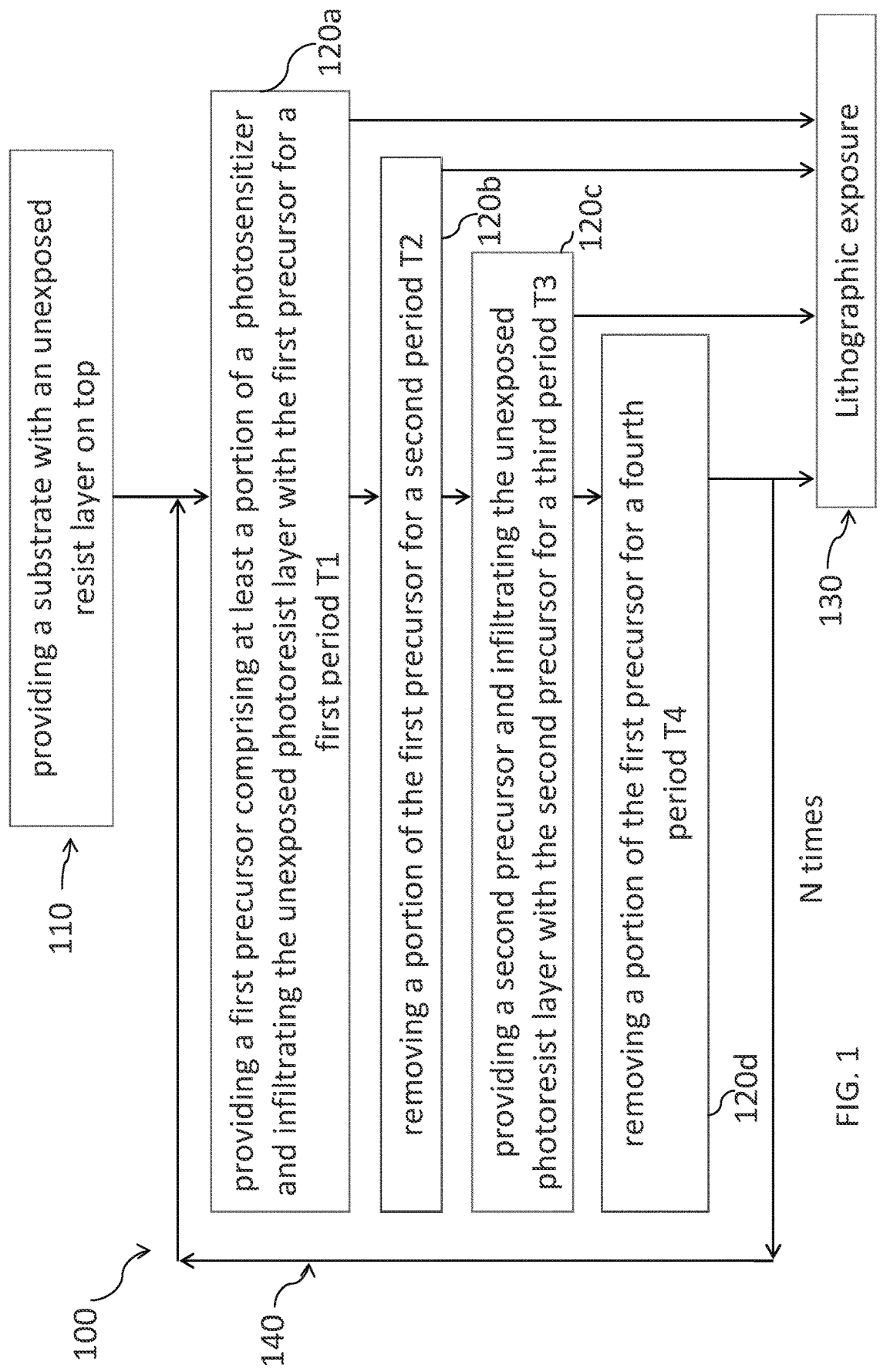
FIG. 1 is a method in accordance with exemplary embodiments of the disclosure.

FIG. 1 illustrates a method 100 in accordance with at least one embodiment of the invention. The method 100 includes a first step 110 of providing a substrate into a reaction chamber, the substrate having an unexposed photoresist layer. The unexposed photoresist layer may be provided on the substrate with a spin coater. The unexposed photoresist layer may be provided directly on the substrate or on top of one or more mask layers provided on the substrate surface. The mask layers may be provided to improve the etch resistance or sticking of the photoresist and/or may function as an anti-reflective coating.

The method 100 may comprise a first step 120a in which the unexposed photoresist layer on the substrate may be infiltrated with an infiltration material by providing a first precursor comprising at least a portion of a photosensitizer to the unexposed photoresist layer on the substrate in the reaction chamber. The photosensitizer may be sensitive to exposure radiation (e.g., EUV) used in the subsequent lithography system. The unexposed photoresist layer on the substrate may be infiltrated with the first precursor for a first period T1 increasing the sensitivity of the unexposed photoresist to the exposure radiation.

Providing and infiltrating the first precursor may occur simultaneously whereby the infiltration start shortly after the first precursor is provided in the reaction chamber. Providing the first precursor in the reaction chamber may be stopped before the infiltration stops. For example, the first precursor may be provided to the substrate by filling the reaction chamber with the first precursor and leaving the first precursor stationary in the reaction chamber for a soaking period. An advantage of soaking may be that less first precursor is consumed.

The first precursor may also be provided to the substrate by continuously flushing the reaction chamber with the first precursor during the first period. The first precursor may also be provided to the substrate by flushing, filling and soaking and/or any combination thereof.

By infiltrating the unexposed photoresist layer on the substrate with the first precursor comprising at least a portion of a photosensitizer sensitive to exposure radiation for a first period T1 the amount of photosensitizer can be increased in the unexposed photoresist layer. The amount of photosensitizer in the photoresist may be limited for example because of its insolubility in the photoresist before spinning it on the substrate. By infiltrating a portion of the photosensitizer after the unexposed photoresist layer is spun on the substrate extra photosensitizer may be provided in the photoresist layer.

The photosensitizer may be infiltrated uniformly over the depth of the photoresist. Alternatively, the photosensitizer may be infiltrated with a higher concentration in the top of the photoresist and with a lower concentration at the bottom of the photoresist. The extra photosensitizer may improve the sensitivity of the resist to the exposure radiation in a subsequent lithographic exposure.

The photosensitizer may be infiltrated in pores of the unexposed photoresist and/or may be diffused in the photoresist layer. The first precursor may react with the unexposed photosensitive layer forming the enhanced unexposed photoresist layer comprising the photosensitizer sensitive to exposure radiation or may just adsorb in the unexposed photoresist. If the first precursor reacts with the unexposed photosensitive layer forming the enhanced unexposed photoresist layer comprising the photosensitizer the enhanced layer may be finished and transferred to a lithographic system for exposure in step 130.

In step 120b a portion of the first precursor may be removed for a second period T2. This may be done by purging with an inert gas such as nitrogen and pumping gasses out of the reaction chamber to clean away any unreacted gases. If the first precursor has reacted sufficiently with the unexposed photosensitive layer forming the enhanced unexposed photoresist layer comprising the photosensitizer the enhanced layer may be finished and transferred to a lithographic system for exposure in step 130. The step 120b may be omitted if the first precursor is fully reacting with the unexposed photoresist without leaving any first precursor remaining in the reaction chamber and/or when the remaining first precursor is allowable in the environment of the reaction chamber.

If the first precursor has just adsorbed in the unexposed photoresist in a step 120a a second precursor may be provided and infiltrated in the unexposed photoresist layer for a third period T3. The first and second precursor may react with each other forming the photosensitizer in the unexposed photoresist or the first precursor may react with the unexposed photosensitive layer and with the second precursor forming the enhanced unexposed photoresist layer comprising the photosensitizer.

Again the substrate may be transferred to a lithographic system for exposure or the infiltration cycle may have a step 120d in which a portion of the second precursor may be removed for a fourth period T4 before transfer to a lithographic system in step 130. The step 120b may be omitted if the second precursor is fully reacting with the unexposed photoresist without leaving any first precursor remaining in the reaction chamber and/or when the remaining first precursor is allowable in the environment of the reaction chamber. The later may be the case if for example water, nitrogen or oxygen is used as the second reactant.

The infiltration sequence may be repeated N times via 140, wherein N is between 1 to 60, preferably 1 to 10 and most preferably between 1 to 5, for example 1, 2, 3 or 4. The precursors are preferably fluids such as vapors or gases during the infiltration. The precursors may be evaporated from a liquid and or sublimated from a solid precursor source. The precursor vapors or gases may be buffered in a buffer volume so as to ensure that enough fluid is present when the precursors are provided to the substrate in the reaction chamber.

Removing the first and/or second precursor may be accomplished by pumping the first or second precursor out of the reaction chamber and alternatively or additionally by providing a purge gas in the reaction chamber to purge the first and/or second precursor away.

The first precursor may be infiltrated for the first period T1 between 1 to 20000, preferably between 5 to 6000, more preferably between 10 to 4000, and most preferably between 20 to 2000 seconds in step 120a. The exact periods may be depending on amongst others the pressure and the reaction chamber volume. In this way a deep infiltration of the first precursor in the unexposed photoresist layer may be achieved.

In step 120b a portion of the first precursor may be removed for a second period T2 between 1 to 20000, preferably between 20 to 6000, more preferably between 50 to 4000, and most preferably between 100 to 2000.

The method in steps 120a to 120d may be by performed in a deposition/infiltration system 200 (FIG. 2), 300 (FIG. 3). The system may be a diffusion oven, a chemical vapor deposition system, an atomic layer deposition system or a dedicated sequential infiltration synthesis system.

The method may comprise controlling the temperature of the reactor chamber to a temperature between 0 and 450° C., preferably between 5° and 150° C., more preferably between 6° and 110° C. and most preferably between 65 and 95° C.

Figure 2:
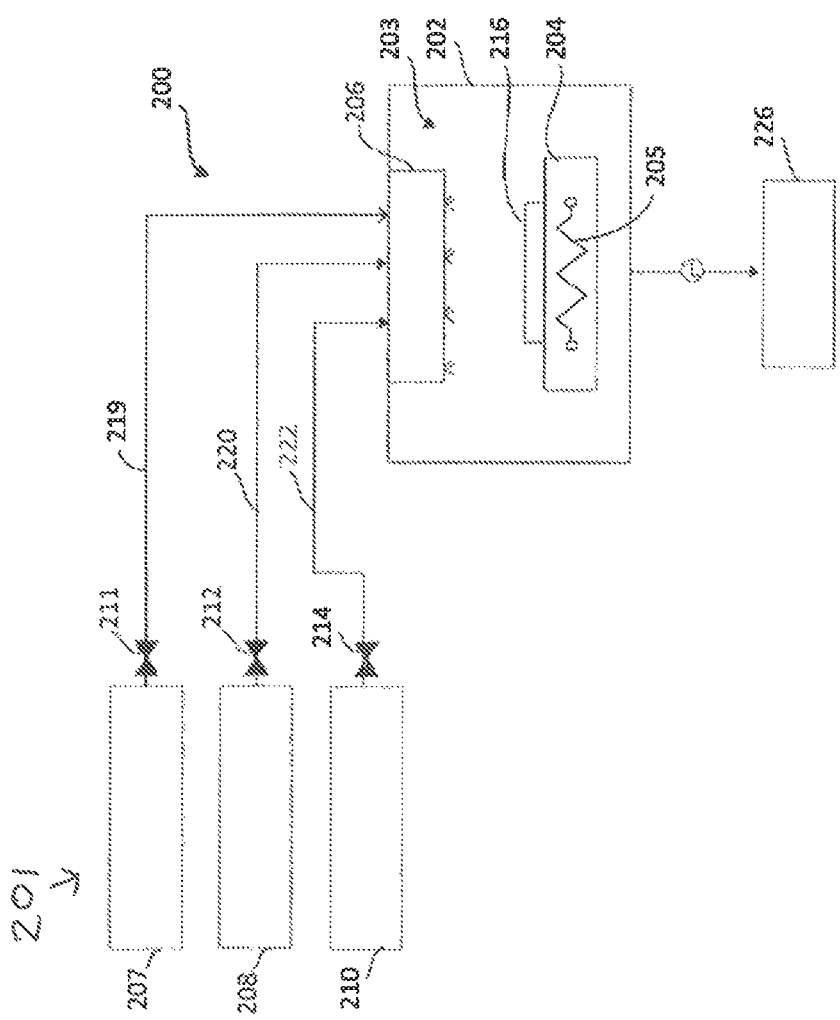
FIG. 2 illustrates a device structure in accordance with exemplary embodiments of the disclosure.

Turning now to FIG. 2, the system 200 for infiltration of at least a portion of the unexposed photoresist layer is illustrated. System 200 may comprise a reactor 202 which may further comprise a first reaction chamber 203, a substrate holder 204, and a gas distribution system 206. The system 200 may also comprise a gas precursor delivery system which may further comprise first precursor source 207; a second precursor source 208; a carrier or purge gas source 210; and valves 211, 212 and 214 interposed between the sources 207, 208, 210, 216 and reactor 202.

Reaction chamber 203 may be a standalone reaction chamber or part of a cluster tool. Further, reaction chamber 203 may be dedicated to an infiltration process as described herein, or reaction chamber 203 may be used for other processes, e.g., for film deposition, removing a portion of at least one polymer layer and one or more additional layer deposition and/or etch processing. For example, reaction chamber 203 may comprise a reaction chamber typically used for chemical vapor deposition (CVD) and/or atomic layer deposition (ALD) processing, and may also comprise direct plasma, and/or remote plasma apparatus.

Further reaction chamber 203 may operate under a vacuum or near atmospheric pressure. By way of one example, reaction chamber 203 may comprise a reaction chamber suitable for ALD deposition of a film by sequentially pulsing the first precursor and the second precursor onto at least one substrate. The reaction chamber may be configured to enable infiltration of at least the first precursor into the unexposed photoresist layer material as well. An exemplary ALD reaction chamber suitable for system 200 is described in U.S. Pat. No. 8,152,922, the contents of which are hereby incorporated herein by reference, to the extent such contents do not conflict with the present disclosure.

Substrate holder 204 may be configured to hold at least one substrate, such as substrate 216, having the unexposed photoresist layer disposed thereon, in place during processing. Additionally or alternatively, the substrate holder 204 may be heated (e.g., by heating element 205), cooled, or be at ambient process temperature during processing. In some embodiments, heating element 205 may be configured to perform an annealing step on the at least one substrate 216.

Although gas distribution system 206 is illustrated in block form, the gas distribution system 206 may be relatively complex and designed to mix vapor (gas) from first precursor source 207, second precursor source 208 and purge gas from gas source 210, prior to distributing the gas mixture to the remainder of reaction chamber 203. Further, gas distribution system 206 may be configured to provide vertical (as illustrated) or horizontal flow of gases to the semiconductor surface. An exemplary gas distribution system is described in U.S. Pat. No. 8,152,922.

First precursor source 207 may be a liquid, solid, or gas comprising a portion of a photosensitizer suitable in an infiltration process. If first precursor source 207 is liquid or solid, the source material may be vaporized or sublimated prior to entering the reaction chamber 203.

Second precursor source 208 may be a liquid, solid, or gas source containing material suitable in an infiltration process. If second precursor source 208 is liquid or solid, the source material may be vaporized or sublimated prior to entering the reaction chamber 203.

The first precursor and the second precursor may be utilized together to deposit and/or infiltrate the unexposed photoresist layer with the photosensitizer. For example, in some embodiments, the system 200 may be configured to deposit and/or infiltrate the photosensitizer comprising a metal.

The metal in the photosensitizer may be selected from the group of alkaline earth metals. The metal in the photosensitizer may comprise Magnesium and/or Calcium.

The metal in the photosensitizer may be selected from the group comprising Aluminium (Al), Galium (Ga), Germanium (Ge), Hafnium (Hf), Zirconium (Zr), Indium (In), Lithium (Li), Tellurium (Te), Antimony (Sb), and Tin (Sn). The enhanced unexposed photoresist layer may comprise a metal oxide of one or more of these metals.

The first precursor may be a metal halide. The metal halide may be Tin (IV) iodide (SnI4) also known as stannic iodide or Tin (IV) chloride (SnCI4) also known as tin tetrachloride or stannic chloride.

For infiltrating zirconium or hafnium the Zr or Hf precursor may comprise metalorganic, organometallic or halide precursor. In some embodiments the precursor is a halide. In some other embodiments the precursor is alkylamine compound of Hf or Zr, such as TEMAZ or TEMAH.

The metal infiltrated may comprise aluminum oxide ($Al_2O_3$), aluminum nitride (AlN), zirconium oxide ($ZrO_2$), or hafnium oxide ($HfO_2$).

The first precursor may be a Metal Alkylamide precursor. The first precursor may comprise one or more of trimethyl aluminum (TMA), triethylaluminum (TEA), and dimethylaluminumhydride (DMAH), Tetraethyltin, Tetramethyltin or Tinacetylacetonate. The infiltration material comprises aluminum as the metal.

Purge gas source 210 may include any suitable gas suitable for purging the first precursor source 207 and/or the second precursor source 208. Carrier or purge gas source 210 may also include any gas suitable for purging reaction chamber 203 before, after or during the deposition and/or infiltration process. In accordance with exemplary embodiments of the disclosure, a purge gas may be nitrogen, argon, helium, or a combination thereof.

As illustrated in FIG. 2, sources 207, 208, and 210 are in fluid communication with reaction chamber 203 via valves 211, 212, and 214, which may be used to control the flow, mixing and distribution of the respective source materials to reaction chamber 203 using the supply lines 219, 220, and 222.

In additional embodiments of the disclosure, a system 300 for depositing and/or infiltrating a unexposed photoresist layer is illustrated with reference to FIG. 3. The system 300 may be similar to that of system 200 but may comprise a reactor 302 which may further comprise a first reaction chamber 203A and a second reaction chamber 203B. Although FIG. 3 illustrates a reactor 302 comprising two reaction chambers it should be appreciated that in some embodiments the reactor 302 may comprise a plurality of reaction chambers, wherein each reaction chamber comprises a substrate holder 204, and a gas distribution system 206, as previously described herein. The substrate holder maybe constructed for holding a single substrate, 2 to 25 substrate (mini batch) or 26 to 200 substrates (full batch). The system 300 may also comprise a first precursor source 207, a second precursor source 208, a carrier or purge gas source 210, and valves 211, 212, and 214 interposed between the sources 207, 208, 210 and the reactor 302.

The system 300 may also comprise a transfer system 304 utilized for transferring a substrate, e.g., a semiconductor, from the first reaction chamber 203A and the second reaction chamber 203B to outside the system. In some embodiments, reaction chambers 203A and 203B may be dedicated to the infiltration process as described herein, or reaction chambers 203A and 203B may be used for other processes, e.g., for layer deposition and/or etch process also. For example, reaction chambers 203A and 203B may comprise reaction chambers typically used for chemical vapor deposition (CVD), infiltration and/or atomic layer deposition processes, as described herein. In additional embodiments, the system 300 may comprise additional reaction chambers for performing additional dedicated processes such as deposition and etch process.

As illustrated in FIG. 3, sources 207 and 208 are in fluid communication with reactor 302 via valves 211, and 212, which may be used to control the flow, mixing and distribution of the respective source materials to reactor chambers 203A and 203B using the supply lines 219, and 220 all part of the common precursor delivery system 201. The method comprising providing a substrate to each reaction chamber and providing the first and/or second precursor to the at least two reaction chambers with a common precursor delivery system 201.

The system may comprise a common precursor removal system 226 (e.g., a vacuum pump). The method may further comprise removing the first or second precursor from the at least two reaction chambers with the common removal system 226.

The system may comprise a common purge system 210, 214, 222. The method may comprise removing the first or second precursor from the at least two reaction chambers by providing a purge gas with the common purge system and/or using the vacuum pump.

In an embodiment the reaction chamber of the system 200 in FIG. 2 is constructed and arranged to accommodate a single substrate 21 in FIG. 1 and the first precursor may be provided for the first period T1 between 1 to 20000, preferably between 20 to 4000, more preferably between 30 and 1000 seconds.

In a further embodiment the reaction chamber of the system is constructed and arranged to accommodate 2 to 25 substrates and the first precursor may be provided for the period T1 between 1 to 16000, preferably between 20 and 7000 and most preferably between 30 and 1500 seconds.

In another embodiment the reaction chamber is constructed and arranged to accommodate 26 to 200 substrates and the first precursor may be provided for the period T1 between 1 to 20000, preferably between 100 to 10000, more preferably between 200 and 6000 and most preferably between 300 and 4000 seconds. Bigger reaction chambers may facilitate more substrates but also may cause longer processing periods T1, T2, T3 or T4.

Before infiltrating the unexposed photoresist layer with infiltration material it may be advantageous to purge the reaction chamber(s) for 1 to 3000 seconds, preferably 120 to 1200 seconds at a temperature between 20 and 600° C., preferably 50 and 150° C. and most preferably 70 and 100° C. to enhance outgassing from the unexposed photoresist layer and cleaning of the reaction chamber.

The first precursor may be provided with a bubbler for the first period T1 in step 120a, which provides a non-continuous first precursor flow having pulses of the first precursor mixed with purge gas for 0.1 to 100, preferably 1 to 3 seconds alternating with pulses of a purge gas for 0.1 to 20, preferably 0.3 to 1 seconds.

The first precursor may be heated before providing the precursor to the reaction chamber to a temperature between room temperature and the boiling temperature at the reaction chamber pressure preferably between 2° and 450° C., more preferably between 3° and 80° C. and even more preferably between 35 and 60° C.

The infiltration system may be provided with a temperature control system comprising a controller, a heater and a temperature sensor to control the temperature in the reaction chamber to a temperature between 0 and 450 C°, preferably between 20 and 150 C°, more preferably between 60 and 110 C° and most preferably between 65 and 95 C°. The reactor chamber(s) may be heated to a temperature between 20 and 450 C°, preferably between 50 and 150 C°, more preferably between 60 and 110 C° and most preferably between 65 and 95 C°. All surfaces in the reactor chamber(s), exhaust line(s) and valves may be heated to between 20 and 450 C°, preferably between 50 and 150 C°, more preferably between 60 and 110 C° and most preferably between 65 and 95 C° to avoid condensation of at least one of the precursors in the system.

The deposition/infiltration system may be provided with a pressure control system comprising a controller, a pump and a purge gas or first precursor supply to control the pressure in the reaction chamber. The pressure in the chamber may be controlled to a value between 0.001 and 1000 Torr, preferably between 1 and 400 Torr, more preferably between 2 and 100 Torr and most preferably between 4 and 50 Torr.

The second precursor may be an oxidant. The oxidant is chosen form the group comprising water, ozone, hydrogen peroxide, ammonia and hydrazine.

The second precursor may also be omitted. The first precursor may react with an OH group present in the resist for example. The first precursor may also react with moisture or oxygen from the ambient air when the substrate is removed from the reactor so that the second precursor is not necessary.

In order to perform the infiltration, precursors to obtain the metal may be used, such as trimethylaluminum (TMA) and water ($H_2O$) for the formation of aluminum oxide ($Al_2O_3$, AlO). The infiltration in the step 120a may take place at a temperature ranging between 2° and 300° C., with a preferable temperature range of 65-95° C. for the formation of aluminum oxide. The temperature during the step 120c may be less than the temperature during the a previous stage, so a cool down step may be needed to go from an example annealing or outgassing temperature of 250° C. to a second step 130 temperature of 70 to 100° C. A temperature of the optional annealing or outgassing process may be at least 25° C. higher than that of the second step 120a-d, preferably between 25-300° C. higher than that of the second step 120, or more preferably between 100-250° C. higher than that of the second step 120.

Infiltration in a single wafer reaction chamber of the TMA at a pressure around 8 Torr may be accomplished by infiltrating of the first precursor for a period T1 ranging from 1 seconds to 2000 seconds preferably between 2 to 600, more preferably between 4 and 400, and most preferably between 6 and 200 seconds. At a pressure around 8 Torr for example an infiltration time of 50 seconds may be accomplished by filling the reaction chamber for 30 second with the first precursor and leaving the first precursor stationary in the reaction chamber to soak the resist on the substrate for 20 seconds giving good results. It must be understood that these periods are dependent on the (partial) pressure of the first precursor and that by increasing the pressure the periods may be shortened.

The step 120b may also then comprise a removal and/or a purge for the second period T2 between 0.01 seconds to 10000 seconds preferably between 1 to 6000, more preferably between 5 and 4000, and most preferably between 20 and 2000 seconds. The removal and/or a purge may be necessary to remove the first precursor from the wall of the reactor so as to able to keep the reactor chamber particles free. In an optimized reactor sticking to the wall of the first precursor may be prevented by other means so that shorter removal/purge periods may be possible.

The step 120c may then comprise a supply of a second precursor, such as water, for a period T3 ranging from 1 to 10000 seconds, preferably 2 to 800 seconds, more preferably 4 to 100 seconds. The second step 120d may then comprise a second removal/purge having a fourth period T4 ranging between 0.01 seconds to 10000 seconds preferably between 1 to 6000, more preferably between 5 and 4000, and most preferably between 20 and 2000 seconds. The removal and/or a purge may be necessary to remove the first precursor from the wall of the reactor so as to able to keep the reactor chamber particles free. In an optimized reactor sticking to the wall of the first precursor may be prevented by other means so that shorter removal/purge periods may be necessary.

Steps 120a-b may be omitted depend on the reaction of the first precursor with the photoresist. Steps 120a-b may also be omitted if the first precursor is allowed to react with the ambient atmosphere (for example with the moisture or the oxygen in the ambient atmosphere) when the substrate is removed from the reaction chamber.

In addition, the steps 120a-d may be repeated as needed in order to obtain sufficient infiltration of the metal or dielectric.

In accordance with at least one embodiment of the invention, a mild bake may be performed before the infiltration to degas/stabilize the resist a bit.

In accordance with at least one embodiment of the invention, the infiltration may precede the optional step of annealing. In this case, the metal may first infiltrate the unexposed photoresist layer material, and then an annealing process may occur. In at least one embodiment of the invention, the optional annealing step and the infiltration take place without any exposure to ambient air.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

What is claimed is:

1. A system for forming an enhanced unexposed photoresist layer with an increased sensitivity to exposure radiation, the system comprising:
   a reactor comprising a first reaction chamber, a substrate holder, and a gas distribution system;
   a temperature control system; and
   a pressure control system,
   wherein the system is configured to:
      receive a substrate with the unexposed photoresist layer in the first reaction chamber; and,
      provide a first precursor comprising at least a portion of a photosensitizer sensitive to exposure radiation to the substrate in the first reaction chamber and retain the first precursor within in the first reaction chamber for a soaking period thereby infiltrating the unexposed photoresist layer on the substrate with the first precursor for a first period T1.

2. The system of claim 1, further comprising a gas precursor delivery system.

3. The system of claim 2, wherein the gas precursor delivery system comprises first precursor source, a second precursor source, and a purge gas source.

4. The system of claim 1, wherein the reactor comprises a direct plasma apparatus.

5. The system of claim 1, wherein the reactor comprises a remote plasma apparatus.

6. The system of claim 1, wherein the substrate holder receives a single substrate.

7. The system of claim 1, wherein the substrate holder receives 2 to 25 substrates.

8. The system of claim 1, wherein the substrate holder receives 26 to 200 substrates.

9. The system of claim 1, further comprising a second reaction chamber.

10. The system of claim 9, further comprising a common precursor removal system fluidly coupled to the first reaction chamber and the second reaction chamber.

11. The system of claim 9, further comprising a common precursor delivery system fluidly coupled to the first reaction chamber and the second reaction chamber.

12. The system of claim 9, further comprising a common purge system fluidly coupled to the first reaction chamber and the second reaction chamber.

13. The system of claim 1, wherein the temperature control system is configured to control surfaces in the reactor chamber to a temperature between 50° C. and 150° C.

14. The system of claim 1, wherein the system is further configured to first infiltrate the unexposed photoresist layer material and then anneal the infiltrated unexposed photoresist layer material.

15. The system of claim 1, wherein the system is further configured to:
   before providing the first precursor:
      purge the first reaction chamber for a period of 120 to 1200 seconds; and
      heat the first reaction chamber to a temperature between 5° and 150° C.

16. The system of claim 15, wherein the system is further configured to:
   cool the substrate by at least 25° C. prior to the step of providing the first precursor.

17. The system of claim 16, wherein the system is further configured to anneal the infiltrated unexposed photoresist layer material.

18. The system of claim 3, wherein the first precursor source comprises magnesium and/or calcium.

\* \* \* \* \*